(12) United States Patent
Lekkala et al.

(10) Patent No.: US 11,043,948 B1
(45) Date of Patent: Jun. 22, 2021

(54) BANDWIDTH ENHANCED AMPLIFIER FOR HIGH FREQUENCY CML TO CMOS CONVERSION

(71) Applicant: QUALCOMM Incorporated, San Diego, CA (US)

(72) Inventors: Suresh Naidu Lekkala, Bangalore (IN); Sajin Mohamad, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/802,684

(22) Filed: Feb. 27, 2020

(51) Int. Cl.
- H03K 19/00 (2006.01)
- H03F 3/45 (2006.01)
- H03K 19/0185 (2006.01)
- H03K 19/003 (2006.01)

(52) U.S. Cl.
CPC . H03K 19/018521 (2013.01); H03F 3/45179 (2013.01); H03F 3/45192 (2013.01); H03K 19/00384 (2013.01)

(58) Field of Classification Search
CPC ... H03K 19/018521; H03K 19/018528; H03K 19/017581; H03K 3/356113; H03K 19/00315; H03K 19/0013; H03K 19/00384; H03F 3/45179; H03F 1/3205; H03F 3/3022; H03F 3/45
See application file for complete search history.

(56) References Cited

U.S. PATENT DOCUMENTS

| | | | |
|---|---|---|---|
| 7,417,505 B2* | 8/2008 | Forbes | H03F 1/08 330/253 |
| 7,692,471 B2* | 4/2010 | Uno | H03F 3/45192 327/337 |
| 9,225,324 B2* | 12/2015 | Arcudia | H03M 9/00 |
| 10,205,445 B1* | 2/2019 | Kansal | H03K 7/08 |
| 10,742,227 B1* | 8/2020 | Schifmann | H03F 3/70 |

* cited by examiner

Primary Examiner — Vibol Tan
(74) Attorney, Agent, or Firm — Chui-kiu T. Wong

(57) ABSTRACT

A bandwidth enhanced amplifier for high frequency CML To CMOS conversion is disclosed. In some implementations, an improved CML to CMOS converter includes a differential amplifier having a first and a second input transistors, and a first and a second load transistors. The first input transistor is coupled in series with the first load transistor, and the second input transistor is coupled in series with the second load transistor. The improved CML to CMOS converter further includes a first capacitor and a second capacitor. The first capacitor is coupled directly between a gate of the first input transistor and a gate of the first load transistor.

20 Claims, 7 Drawing Sheets

BANDWIDTH ENHANCED AMPLIFIER FOR HIGH FREQUENCY CML TO CMOS CONVERSION

FIELD OF DISCLOSURE

Aspects of the present disclosure relate generally to semiconductor chip input/output design, and more particularly to bandwidth enhanced amplifier for high frequency current mode logic (CML) To complementary metal oxide semiconductor (CMOS) conversion.

BACKGROUND

In semiconductor input/output (I/O) design, current mode logic (CML) circuitry is commonly used, especially for processing clock signals for high speed applications. Although CML circuitry provides the benefit of low power consumption even at high speed operations, not all circuit blocks in an I/O interface can be implemented using CML circuitry. Thus, a CML converter is needed to convert signals to/from CML circuitry.

SUMMARY OF THE DISCLOSURE

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

In some implementations, an improved CML to CMOS converter includes a differential amplifier having a first and a second input transistors, and a first and a second load transistors. The first input transistor is coupled in series with the first load transistor, and the second input transistor is coupled in series with the second load transistor. The improved CML to CMOS converter further includes a first capacitor and a second capacitor. The first capacitor is coupled directly between a gate of the first input transistor and a gate of the first load transistor.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

In a typical input/output (I/O) interface, a phase interpolator is used to adjust clock signals, which is then provided to a sampler. The sampler can use the adjusted clock signals to sample incoming data. Since the phase interpolator is typically implemented in current mode logic (CML), while the sampler is typically implemented using complementary metal oxide semiconductor (CMOS) logic, there is a need to convert the CML signals from the phase interpolator to signals usable by CMOS based circuits.

Figure 1:
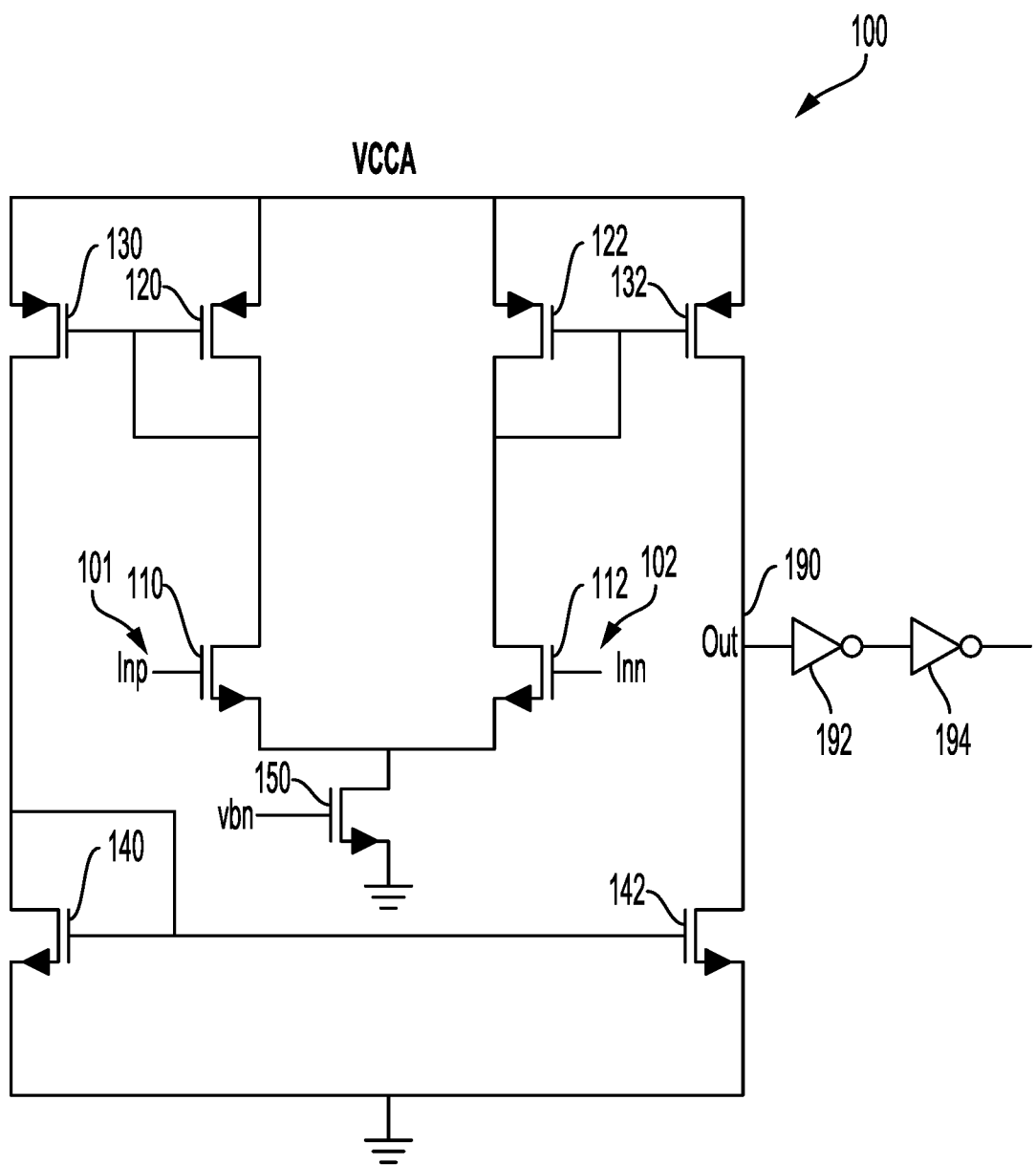
FIG. 1 is a conventional differential amplifier.

One conventional approach is simply using a differential amplifier to convert CML signals to signals usable by CMOS based circuits. FIG. 1 shows a conventional differential amplifier 100 suitable for such purpose. The differential amplifier 100 includes a pair of input transistors 110 and 112, a pair of load transistors 120 and 122, a pair of p-type metal oxide semiconductor (pMOS) transistors 130 and 132, a pair of n-type metal oxide semiconductor (nMOS) transistors 140 and 142, and a bias transistor 150. The pair of input transistors 110 and 112 are nMOS transistors and the pair of load transistors 120 and 122 are pMOS transistors.

The input transistors 110 and 112 are configured as an input stage of the differential amplifier 100. Specifically, the gates of the input transistors 110 and 112 are configured to receive a pair of differential signals Inp 101 and Inn 102. The pair of differential signals Inp 101 and Inn 102 are CML signals. The sources of the input transistors 110 and 112 are coupled to the drain of the bias transistor 150, which is an nMOS transistor. The source of the bias transistor 150 is coupled to ground. The drains of the input transistors 110 and 112 are coupled to the drains and gates of the load transistors 120 and 122, respectively. The sources of the load transistors 120 and 122 are coupled to a voltage supply VCCA. The sources of the pair of pMOS transistors 130 and 132 are also coupled to the voltage supply VCCA. The gates of the pMOS transistors 130 and 132 are coupled to the gates and drains of the load transistors 120 and 122, respectively. The drains of the pMOS transistors 130 and 132 are coupled to the drains of the nMOS 140 and 142, respectively. The node at which the drain of the pMOS 132 and the drain of the nMOS 142 are coupled together is configured as an output node 190. The output node 190 may be further coupled to a pair of inverters 192 and 194. The pair of inverters 192 and 194 are coupled in series to provide a buffer to the output of the differential amplifier 100. The sources of the nMOS 140 and 142 are coupled to the ground. The drain and gate of the nMOS 140 are coupled together in a diode configuration. The gates of the nMOS 140 and 142 are coupled together.

With sufficient gain, the differential amplifier 100 can convert CML signals into signals usable by CMOS circuits as follows. The input transistors 110 and 112 receive a pair of differential signals Inp 101 and Inn 102, which are CML signals. When Inp 101 is high and Inn 102 is low, the input transistor 110 would be turned on and the input transistor 112 would be turned off. As such, there is a current flowing through the load transistor 120, the input transistor 110, and the bias transistor 150, but no current flows through the load transistor 122 and the input transistor 112. Since pMOS transistor 130 and load transistor 120 are configured as a current mirror, a current substantially similar to the current flowing through the load transistor 120 flows through the pMOS transistor 130 and then through the nMOS transistor 140. This results in a high voltage at the drain and gate of the nMOS transistor 140, which are connected to the gate of the nMOS transistor 142. Thus, the nMOS transistor 142 is turned on, and pulls down the voltage at the output node 190 as current flows through the nMOS transistor 142 to ground. When Inp 101 is low and Inn 102 is high, the input transistor 112 would be turned on and the input transistor 110 would be turned off. As such, there is a current flowing through the load transistor 122, the input transistor 112, and the bias transistor 150, but no current flows through the load transistor 120 and the input transistor 110. This results in a low voltage at the gate of the load transistor 122, which is also connected to the gate of the pMOS transistor 132. As such, the pMOS transistor 132 is turned on, and the output node 190 would be pulled high. However, the bandwidth of the differential amplifier 100 is somewhat limited. To improve or enhance the bandwidth, the differential amplifier 100 is modified as shown in FIG. 2.

Figure 2:
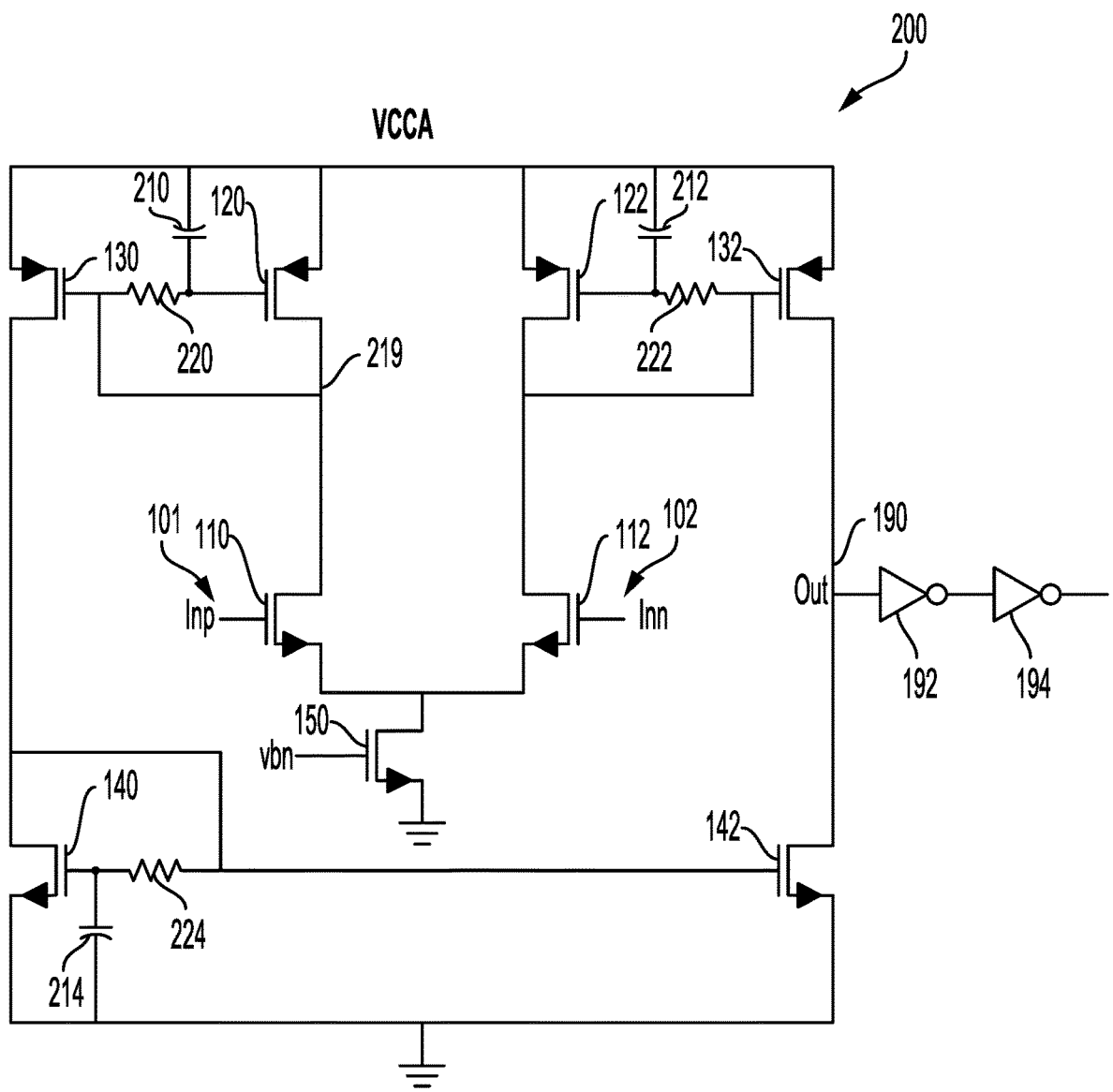
FIG. 2 is a conventional current mode logic (CML) to complementary metal oxide semiconductor (CMOS) converter with bandwidth enhancement.

FIG. 2 is a conventional current mode logic (CML) to complementary metal oxide semiconductor (CMOS) converter 200 with bandwidth enhancement. The CML to CMOS converter 200 is substantially similar to the differential amplifier 100 in FIG. 1, and like elements are labeled with similar reference numerals in FIG. 2. The key difference between the converter 200 and the differential amplifier 100 is the addition of a resistor and a capacitor on each side of the converter 200 for bandwidth enhancement. Specifically, a capacitor 210 is added between the gate and the source of the load transistor 120, and a resistor 220 is added between the gate and the drain of the load transistor 120. Likewise, a capacitor 212 is added between the gate and the source of the load transistor 122, and a resistor 222 is added between the gate and the drain of the load transistor 122.

During operation at high frequency, the capacitor 210 is shorted. In other words, the gate and the source of the load transistor 120 is shorted at high frequency. Likewise, the capacitor 212 is shorted at high frequency, causing the gate and the source of the load transistor 122 to be shorted at high frequency as well. Shorting the gate and the source of the load transistors 120 and 122, respectively, at high frequency causes a peak in the bandwidth curve of the converter 200. The signal gain can be determined using the load capacitance $C_1$ seen at the output node 219 of the input stage:

$$\text{Gain} = gm_n * (1/(sC_1)), \quad [1]$$

where $gm_n$ is the transconductance of the input transistor 110, and s is the frequency in Fourier domain.

Figure 3:
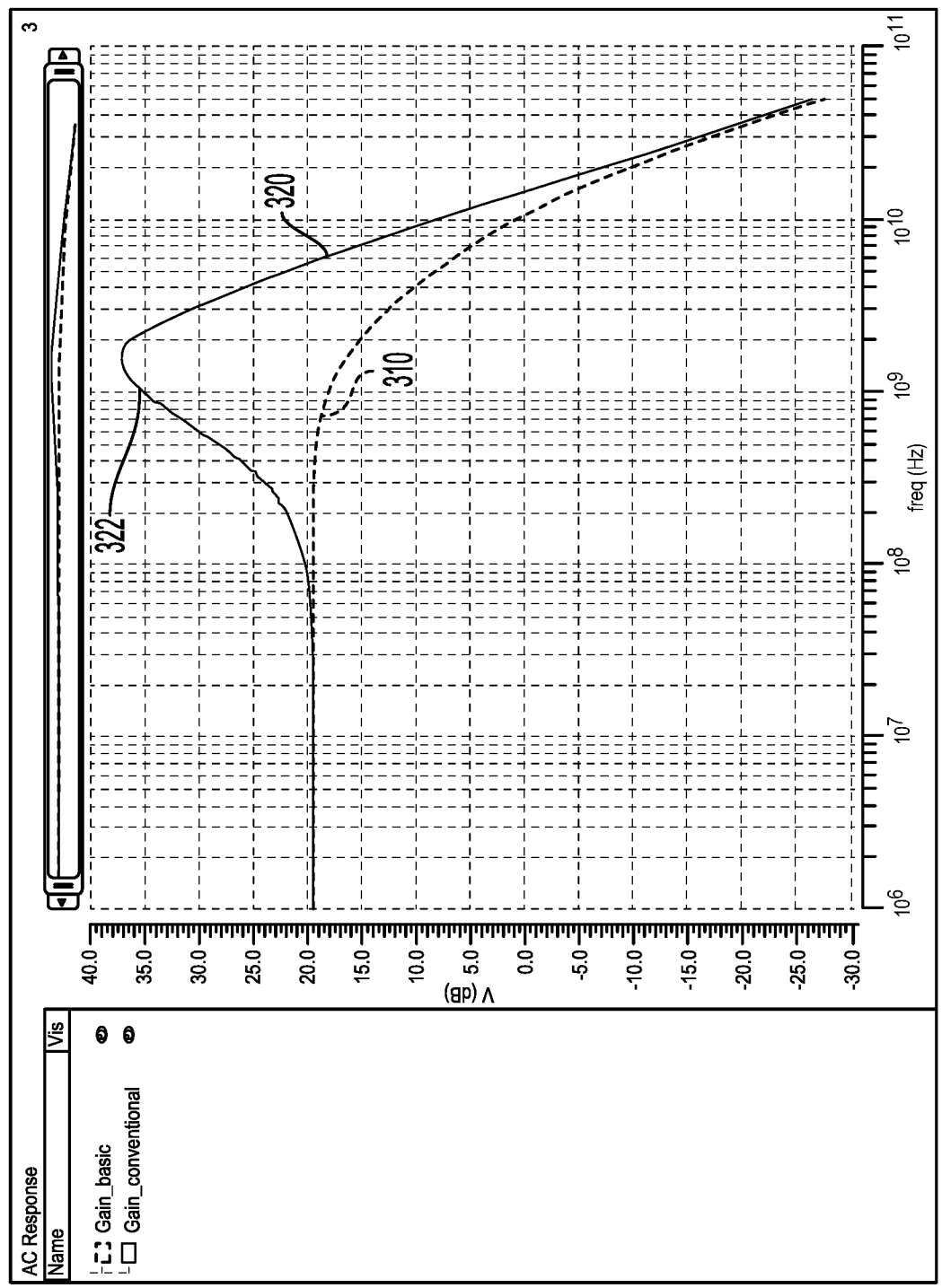
FIG. 3 is a plot comparing bandwidths of the conventional differential amplifier in FIG. 1 and the conventional CML to CMOS converter with bandwidth enhancement in FIG. 2.

FIG. 3 is a plot comparing bandwidths of the conventional differential amplifier 100 in FIG. 1 and the conventional CML to CMOS converter 200 with bandwidth enhancement in FIG. 2. Curve 310 is the bandwidth curve of the conventional differential amplifier 100, and curve 320 is the bandwidth curve of the conventional CML to CMOS converter 200. As shown in FIG. 3, the bandwidth at higher frequencies (starting at about $10^8$ Hertz) of the converter 200 is enhanced compared to the conventional differential amplifier 100. But there is a peak 322 in the bandwidth curve 320, which is caused by the capacitors 210 and 212 as explained above. Because there is a peak at high frequencies, power consumption of operation at high frequencies is higher using the conventional CML to CMOS converter 200. Therefore, it is desired to provide a CML to CMOS converter with enhanced bandwidth while keeping the power consumption at high frequencies in check. Implementations of an improved CML to CMOS converter providing such benefits are discussed in details below.

In some implementations, an improved CML to CMOS converter includes a differential amplifier having a first and a second input transistors, and a first and a second load transistors. The first input transistor is coupled in series with the first load transistor, and the second input transistor is coupled in series with the second load transistor. The improved CML to CMOS converter further includes a first capacitor and a second capacitor. The first capacitor is coupled directly between a gate of the first input transistor and a gate of the first load transistor. Likewise, the second capacitor is coupled between a gate of the second input transistor and a gate of the second load transistor. The first and second capacitors each provides a feed forward path through the respective load transistor. Since the load transistors also amplify signals, additional high frequency gain can be achieved. This improved CML to CMOS converter is thus particularly well suited for high frequency applications because there is little additional current consumption compared with the conventional converter 200 in FIG. 2. More details are discussed below with reference to FIG. 4.

Figure 4:
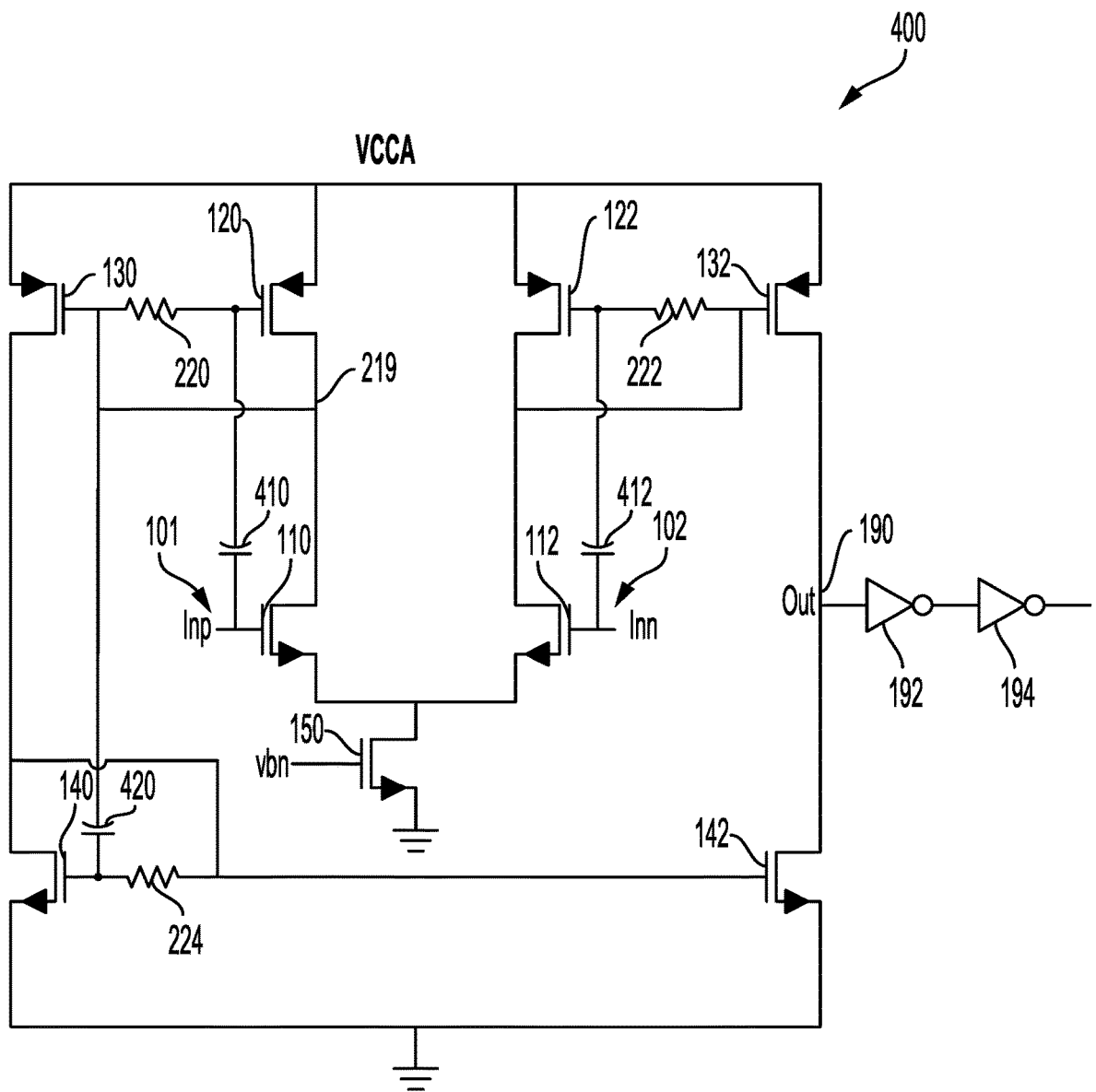
FIG. 4 is one implementation of a CML to CMOS converter for high frequency design.

FIG. 4 is one implementation of an improved CML to CMOS converter 400 for high frequency design. The improved converter 400 is a differential amplifier based converter and includes components similar to the differential amplifier 100 discussed above. Specifically, the improved converter includes a pair of input transistors 110 and 112, a pair of load transistors 120 and 122, a pair of pMOS transistors 130 and 132, a pair of nMOS transistors 140 and 142, and a bias transistor 150. The pair of input transistors 110 and 112 are nMOS transistors and the pair of load transistors 120 and 122 are pMOS transistors. The bias transistor 150 is an nMOS transistor.

The input transistors 110 and 112 are configured as an input stage of the improved converter 400. Specifically, the gates of the input transistors 110 and 112 are configured to receive a pair of differential signals Inp 101 and Inn 102. The pair of differential signals Inp 101 and Inn 102 are CML signals. The sources of the input transistors 110 and 112 are coupled to the drain of the bias transistor 150, which is an nMOS transistor. The source of the bias transistor 150 is coupled to ground. The drains of the input transistors 110 and 112 are coupled to the drains and gates of the load transistors 120 and 122, respectively. The sources of the load transistors 120 and 122 are coupled to a voltage supply VCCA. The sources of the pair of pMOS transistors 130 and 132 are also coupled to the voltage supply VCCA. The gates of the pMOS transistors 130 and 132 are coupled to the gates and drains of the load transistors 120 and 122, respectively.

In other words, the transistor 130 is coupled in parallel to the load transistor 120, and the transistor 132 is coupled in parallel to the load transistor 122. The drains of the pMOS transistors 130 and 132 are coupled to the drains of the nMOS 140 and 142, respectively. In other words, the pMOS transistor 130 and the nMOS transistor 140 are coupled with each other in series, and the pMOS transistor 132 and the nMOS transistor 142 are coupled to each other in series as well. The node at which the drain of the pMOS 132 and the drain of the nMOS 142 are coupled together is configured as an output node 190. The output node 190 may be further coupled to a pair of inverters 192 and 194. The sources of the nMOS 140 and 142 are coupled to the ground.

In addition to the above components, the improved converter 400 includes three resistors 220, 222, and 224, three capacitors 410, 412, and 420. Resistor 220 is coupled between the gate of the load transistor 120 and the gate of the transistor 130. Likewise, Resistor 222 is coupled between the gate of the load transistor 122 and the gate of the transistor 132. Resistor 224 is coupled between the gate of transistor 140 and the gate of transistor 142. The drain of the transistor 140 is also coupled to the node at which resistor 224 and the gate of the transistor 142 are coupled together. Capacitor 410 is coupled directly between the gate of the input transistor 110 and the gate of the load transistor 120. Likewise, capacitor 412 is coupled directly between the gate of the input transistor 112 and the gate of the load transistor 122. Capacitor 420 is also coupled directly between the gate of the transistor 140 and the gate of the transistor 130. Each of the capacitors 410, 412, and 422 has a capacitance of about 50 fF in some implementations.

In some implementations, the capacitor 410 between the gates of the input transistor 110 and the load transistor 120 provides a feed forward path through the load transistor 120 in order to improve performance. Specifically, the load transistor 120 can also amplify the input signal Inp 101. The gain at the internal output node 419 of the input stage can be determined by:

$$\text{Gain} = (gm_n + gm_p) \ast (1/(sC_1)), \qquad [2]$$

where $gm_n$ is the transconductance of the input transistor 110, $gm_p$ is the transconductance of the load transistor 120, $C_1$ is the load capacitance looking into the node at which the resistor 220 and the drain of the load transistor 120 are coupled together, and s is the frequency in Fourier domain. As shown in equation [2] above, the gain achieved by the improved converter 400 is greater than the gain of the conventional converter 200 by $gm_p/(sC_1)$. Similar benefit can be provided by the other capacitors 412 and 420 because these capacitors 412 and 420 also provide a respective feed forward path to increase gain. This greater gain is further illustrated by the bandwidth curves of one implementation of the improved converter 400 and the conventional CML to CMOS converter 200 in FIG. 5.

Figure 5:
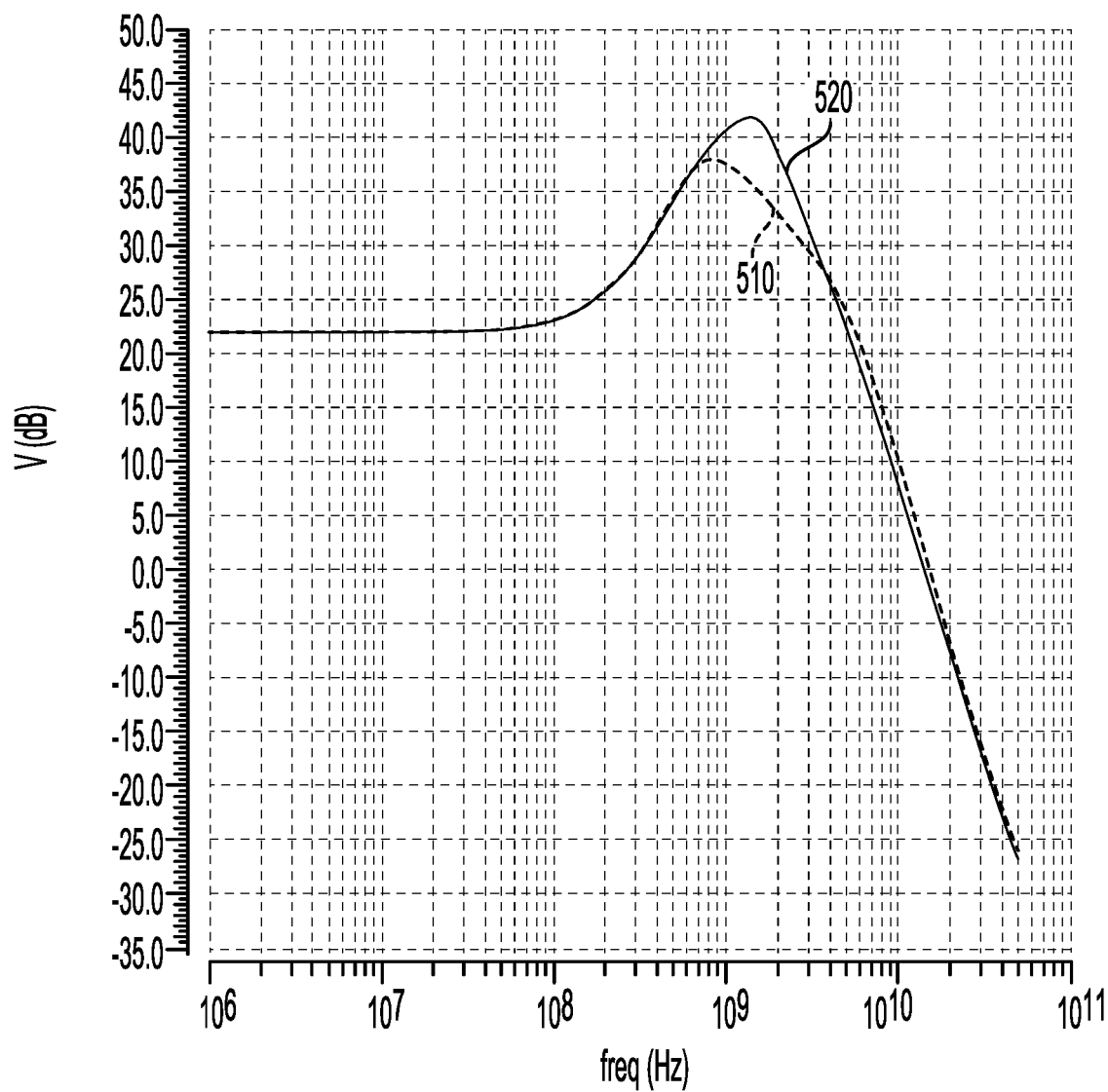
FIG. 5 is a plot comparing the bandwidths of the improved CML to CMOS converter for high frequency design in FIG. 4 and the conventional CML to CMOS converter with bandwidth enhancement in FIG. 2.

FIG. 5 is a plot comparing the bandwidths of the improved CML to CMOS converter 400 for high frequency design in FIG. 4 and the conventional CML to CMOS converter 200 with bandwidth enhancement in FIG. 2. Curve 510 represents the gain achieved by the conventional converter 200 at various frequencies. Curve 520 represents the gain achieved by one implementation of the improved converter 400 at various frequencies. As shown in FIG. 5, the gain achieved by the improved converter 400 is higher in a high frequency range of about $10^9$ to $10^{10}$ Hertz. This gain amounts to approximately 50% performance improvement at the same power. Alternatively, power can be reduced by about 30% for the same PPA. With the improved performance and lower power consumption, the improved CML to CMOS converter 400 is particularly suited for high speed applications, such as high speed serializer/deserializer (SerDes) input/output (I/O) designs for both data and/or clock signals. For example, in one implementation of a voltage controlled oscillator (VCO) clock, a phase interpolator (PI) outputs clock signals to a sampler at very high frequency. This demands huge current in CML to CMOS conversion with low swing, which can be met by the improved converter 400. An exemplary system on chip (SoC) incorporating the improved CML to CMOS converter 400 is discussed in details below with reference to FIG. 6.

Figure 6:
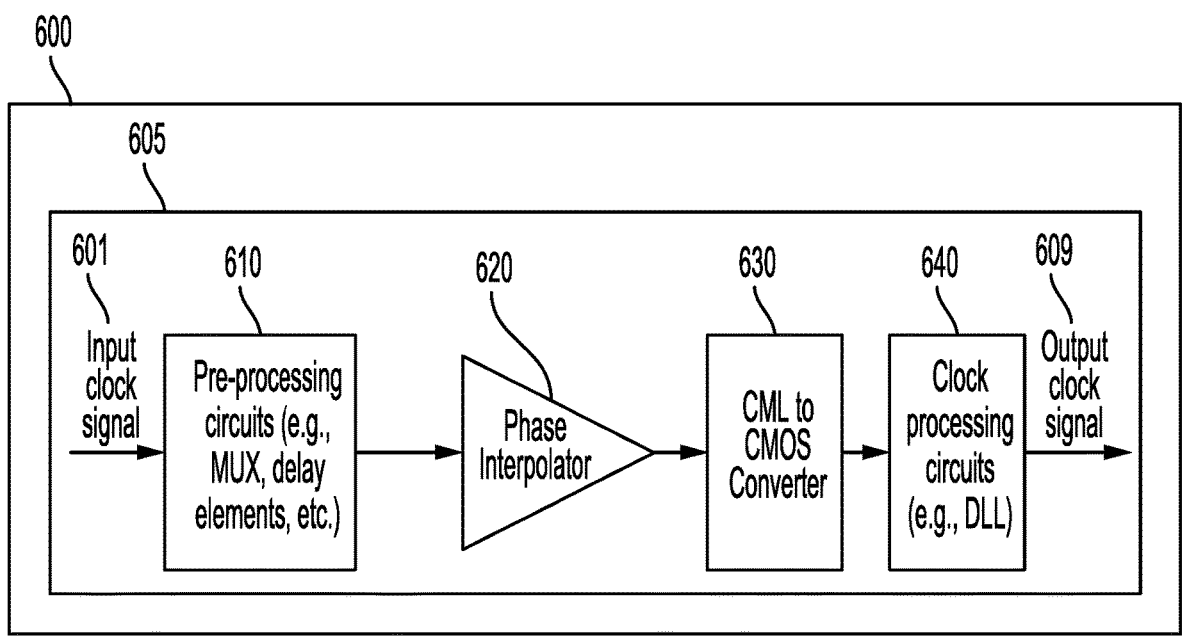
FIG. 6 is a block diagram of one implementation of an input/output I/O interface in a system on chip (SoC).

FIG. 6 is a block diagram of one implementation of an input/output I/O interface in a SoC 600. The SoC 600 includes an I/O 605. To avoid obscuring the view of the illustration, other components within the SoC 600 are not shown in FIG. 6. But one of skill in the art would appreciate that the SoC 600 can include other components, such as, for example, memory devices (e.g., static random access memory), processing devices (e.g., general purpose processor, graphics processor, etc.), sensors (e.g., voltage sensors, thermal sensors, etc.), etc. The I/O 605 can be a serial I/O, like a SerDes I/O. The I/O 605 includes pre-processing circuits 610, a phase interpolator 620, a CML to CMOS converter 630, and clock processing circuits 640.

In some implementations, the pre-processing circuits 610 receive an input clock signal 601. The pre-processing circuits 610 can include multiplexers, delay elements, etc. After pre-processing the input clock signal 601, the pre-processing circuits 610 outputs a clock signal to the phase interpolator 620. Note that the phase interpolator 620 typically performs phase interpolation in current mode logic (CML). After interpolating the phase of the pre-processed clock signal, the phase interpolator 620 sends its CML output to the CML to CMOS converter 630. One example of the CML to CMOS converter 630 is the improved converter 400 shown in FIG. 4. The converter 630 converts the CML output from the phase interpolator 620 into a CMOS signal and then forwards the CMOS signal to the clock processing circuits 640. The clock processing circuits 640 can further process the CMOS signal before sending it to the rest of the I/O 605. The clock processing circuits 640 can include a delay locked loop (DLL), a phase locked loop (PLL), etc.

Figure 7:
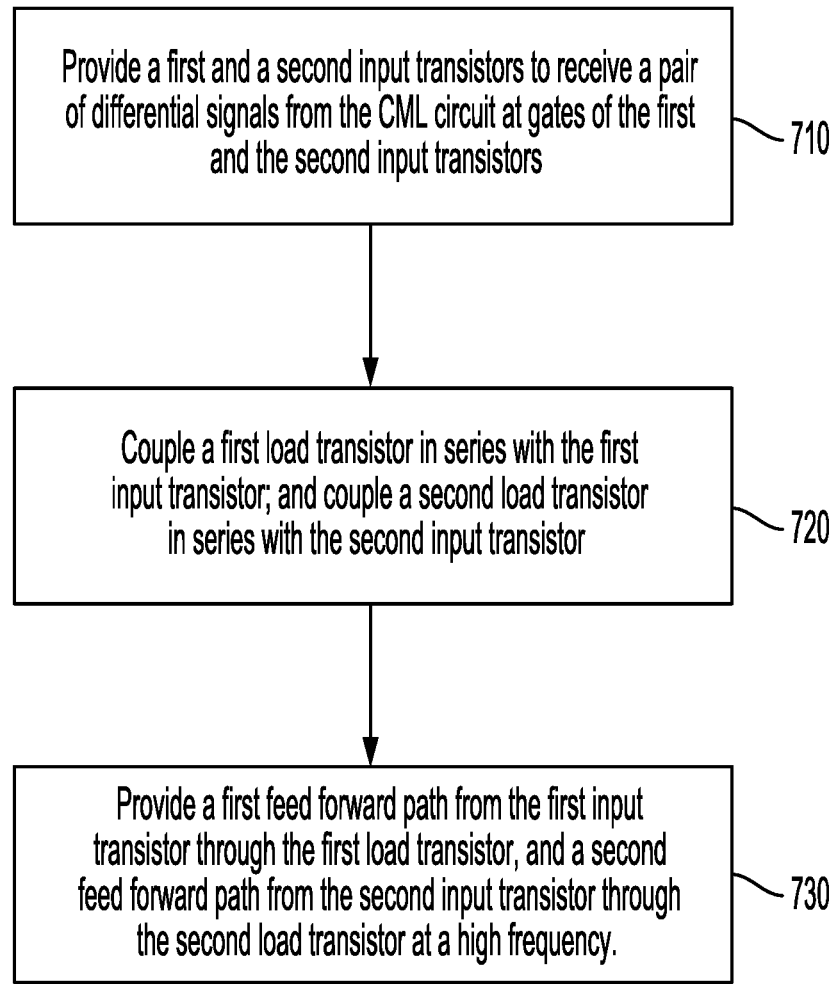
FIG. 7 shows a flow diagram of one implementation of a method to convert signals from a current mode logic (CML) circuit to signals usable by complementary metal oxide semiconductor (CMOS) based circuit.

FIG. 7 shows a flow diagram of one implementation of a method to convert signals from a CML circuit to signals usable by CMOS based circuit. In some implementations, the process illustrated in FIG. 7 can be performed by the improved CML to CMOS converter 400 shown in FIG. 4.

The process begins at block 710, where a first and a second input transistors are provided to receive a pair of differential signals from a CML circuit (e.g., the phase interpolator 620 in FIG. 6) at the gates of the first and the second input transistor. Then the process transitions to block 720, where a first load transistor is coupled in series with the first input transistor, and a second load transistor is coupled in series with the second input transistor. The process then transitions to block 730, where a first feed forward path is provided from the first input transistor through the first load transistor, and a second feed forward path is provided from the second input transistor through the second load transistor. For example, the feed forward path can be provided using a capacitor coupled between the gates of the respective input transistor and load transistor (e.g., the capacitor 410 between the gates of the input transistor 110 and the load transistor 120 in FIG. 4). The feed forward path allows the load transistor to amplify the input signal as well, thus, achieving a higher gain when operating at higher frequencies.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A current mode logic (CML) to complementary metal oxide semiconductor (CMOS) converter, comprising:
   a differential amplifier having
      a first and a second input transistors,
      a first and a second load transistors, wherein the first input transistor is coupled in series with the first load transistor, and the second input transistor is coupled in series with the second load transistor,
      a first transistor coupled in parallel with the first load transistor, and
      a resistor having a first and a second terminals; and
   a first capacitor coupled directly between a gate of the first input transistor and a gate of the first load transistor, the first terminal of the resistor coupled to a gate of the first transistor and the second terminal of the resistor coupled to the gate of the first load transistor and the first capacitor.

2. The CML to CMOS converter of claim 1, further comprising:
   a second capacitor coupled between a gate of the second input transistor and a gate of the second load transistor.

3. The CML to CMOS converter of claim 1, wherein the first capacitor is configured to provide a feed forward path through the first load transistor.

4. The CML to CMOS converter of claim 1, wherein the first capacitor has a capacitance of about 50 fF.

5. The CML to CMOS converter of claim 1, wherein the differential amplifier further comprises:
   a second transistor coupled in series with the first transistor such that a drain of the second transistor is coupled to a drain of the first transistor.

6. The CML to CMOS converter of claim 1, further comprising:
   a third capacitor coupled between a gate of the second transistor and a gate of the first transistor, wherein the gate of the first transistor is further coupled to a drain of the first load transistor and a drain of the first input transistor.

7. The CML to CMOS converter of claim 1, wherein the first and the second input transistors are n-type metal oxide semiconductor (nMOS) transistors, and the first and the second load transistors are p-type metal oxide semiconductor (pMOS) transistors.

8. The CML to CMOS converter of claim 7, wherein the differential amplifier further comprises a bias transistor coupled between sources of the first and the second input transistors and ground, and the bias transistor is an nMOS transistor.

9. The CML to CMOS converter of claim 1, wherein the first and the second input transistors are configured to receive a pair of differential signals at their gates from a CML circuit.

10. The CML to CMOS converter of claim 9, wherein the CML circuit includes a phase interpolator.

11. A system on chip (SoC), comprising:
    a phase interpolator to adjust a phase of an input clock; and
    a current mode logic (CML) to complementary metal oxide semiconductor (CMOS) converter coupled to the phase interpolator to receive output signals from the phase interpolator,
    a differential amplifier having
       a first and a second input transistors,
       a first and a second load transistors, wherein the first input transistor is coupled in series with the first load transistor, and the second input transistor is coupled in series with the second load transistor,
       a first transistor coupled in parallel with the first load transistor, and
       a resistor having a first and a second terminals; and
    a first capacitor coupled directly between a gate of the first input transistor and a gate of the first load transistor, the first terminal of the resistor coupled to a gate of the first transistor and the second terminal of the resistor coupled to the gate of the first load transistor and the first capacitor.

12. The SoC of claim 11, wherein the CML to CMOS converter further comprises:
    a second capacitor coupled between a gate of the second input transistor and a gate of the second load transistor.

13. The SoC of claim 11, wherein the first capacitor is configured to provide a feed forward path through the first load transistor.

14. The SoC of claim 11, wherein the first capacitor has a capacitance of about 50 fF.

15. The SoC of claim 11, wherein the differential amplifier further comprises:
    a second transistor coupled in series with the first transistor such that a drain of the second transistor is coupled to a drain of the first transistor.

16. The SoC of claim 11, wherein the CML to CMOS converter further comprises:
    a third capacitor coupled between a gate of the second transistor and a gate of the first transistor, wherein the gate of the first transistor is further coupled to a drain of the first load transistor and a drain of the first input transistor.

17. The SoC of claim 11, further comprising a delay locked loop (DLL) coupled to the CML to CMOS converter to receive a clock signal from the CML to CMOS converter.

18. The SoC of claim 12, further comprising a Serializer-Deserializer (SerDes) input/output (I/O) interface, wherein the phase interpolator and the CML to CMOS converter are part of the SerDes I/O interface.

19. A method to convert signals from a current mode logic (CML) circuit to signals usable by complementary metal oxide semiconductor (CMOS) based circuit, the method comprising:
    providing a first and a second input transistors to receive a pair of differential signals from the CML circuit at gates of the first and the second input transistors, and
    coupling a first load transistor in series with the first input transistor;
    coupling a second load transistor in series with the second input transistor;
    coupling a first transistor in parallel with the first load transistor; and
    providing a first feed forward path from the first input transistor through the first load transistor, and a second feed forward path from the second input transistor through the second load transistor at high frequency, wherein providing the first feed forward path comprises coupling a first capacitor directly between the gate of the first input transistor and a gate of the first load transistor, and coupling a resistor between the gate of the first load transistor and a gate of the first transistor.

20. The method of claim 19, wherein providing the second feed forward path comprises coupling a second capacitor directly between the gate of the second input transistor and a gate of the second load transistor.

\* \* \* \* \*